United States Patent
Huang et al.

(10) Patent No.: US 6,344,369 B1
(45) Date of Patent: Feb. 5, 2002

(54) METHOD OF PROTECTING A BOND PAD STRUCTURE, OF A COLOR IMAGE SENSOR CELL, DURING A COLOR FILTER FABRICATION PROCESS

(75) Inventors: Chia-Mei Huang; Chao-Yi Lan, both of Hsin-Chu; Hsiao-Ping Chang, Shin-Chu; Chia-Kung Chang, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/609,673

(22) Filed: Jul. 3, 2000

(51) Int. Cl.[7] .................. H01L 21/00; H01L 21/44; H01L 21/302
(52) U.S. Cl. .................. 438/70; 438/612; 438/738
(58) Field of Search .................. 438/70, 612, 624, 438/627, 637, 704, 738

(56) References Cited

U.S. PATENT DOCUMENTS

| | | | |
|---|---|---|---|
| 4,536,949 A | * 8/1985 | Takayama et al. | 29/578 |
| 4,783,691 A | 11/1988 | Harada | 357/30 |
| 5,252,844 A | * 10/1993 | Takagi | 257/296 |
| 5,672,519 A | * 9/1997 | Song et al. | 437/3 |
| 5,719,087 A | 2/1998 | Chen et al. | 438/612 |
| 5,854,091 A | * 12/1998 | Back et al. | 438/70 |
| 6,001,538 A | * 12/1999 | Chen et al. | 430/316 |
| 6,214,717 B1 | * 4/2001 | Lan et al. | 438/612 |

FOREIGN PATENT DOCUMENTS

| | | | | |
|---|---|---|---|---|
| JP | 362118573 A | * | 5/1987 | |
| JP | 403035557 A | * | 2/1991 | |
| JP | 02000031448 A | * | 1/2000 | |
| JP | 02000164836 A | * | 6/2000 | |

* cited by examiner

*Primary Examiner*—John F. Niebling
*Assistant Examiner*—Viktor Simkovic
(74) *Attorney, Agent, or Firm*—George O. Saile; Stephen B. Ackerman

(57) ABSTRACT

A process for forming a color image sensor cell, in which a bonding pad structure is protected from exposure to alkaline developer solution, used for definition of color filter elements, and also used to open a contact hole to the bonding pad structure, has been developed. The process features the use of a passivation layer, comprised of an overlying silicon nitride layer, and an underlying silicon oxide layer, located on the top surface of the bonding pad structure. The passivation layer protects the underlying bond pad structure from alkaline developer solutions used to define overlying color filter elements, of the color image sensor cell. After definition of the color filter elements the contact hole opening to the bond pad is finalized using a dry etching procedure, applied to the passivation layer. By use of this invention the bond pad structure is protected by the passivation layer during the color filter process, preventing stain and discolouring of the bond pad structure, by the alkaline developer solution used for definition of the color filter elements, thus resulting in improvements of the mechanical properties, as well as the bondabilty properties, of bond pad structure.

9 Claims, 4 Drawing Sheets

METHOD OF PROTECTING A BOND PAD STRUCTURE, OF A COLOR IMAGE SENSOR CELL, DURING A COLOR FILTER FABRICATION PROCESS

BACKGROUND OF THE INVENTION (1) Field of the Invention

The present invention relates to methods used to fabricate a color image sensor cell, and more specifically to a method used to protect a bond pad structure from the processes used to define the color filter elements of the color sensor cell.

(2) Description of Prior Art

Color image sensor cells are usually comprised with metal structures, used as cell electrodes for picture elements, and used as bonding pads, which are needed for electrical connection with external circuits. In addition the color image sensor cell is comprised of color filter elements formed on a dielectric layer, overlying the cell electrodes, and bonding pad structures. However the process of forming the color filter elements can degrade the bonding pad, if the top surface of the bonding pad is exposed to the processes used to define the overlying color filter elements. Degradation of the bonding pad, via staining, occurring as a result of a wet developer step performed during the development cycle of the color filter elements, can result in yield loss due to poor wire bonds, or reliability failures in terms of wire bond failures occurring during the lifetime of the color image sensor cell.

This invention will describe a process sequence for forming a color image sensor cell in which the top surface of bonding pad is protected during the processes used to form the color filter elements, thus preventing exposure of the top surface of the bonding pad to the developer solution, used to define the color filter elements. Prior art, such as Harada et al, in U.S. Pat. No. 4,783,691, describe a method of forming a color image sensor, however that prior art does not detail the opening made to the bonding pad, in terms of etchant used, whereas this present invention features a final dry etching procedure, for exposure of the bonding pad, while the bonding pad remains protected during the color filter image sensor cell definition.

SUMMARY OF THE INVENTION

It is an object of this invention to fabricate a color image sensor cell, comprised with picture element, cell electrodes, bonding pad structures, and color filter elements.

It is another object of this invention to deposit a dielectric layer on the underlying bonding pad, prior to the formation and definition of the color filter elements, to protect the surface of the bonding pad during a wet developer cycle used for the definition of the color filter elements.

It is yet another object of this invention to define the contact opening to bond pad structure using a final dry etching procedure.

In accordance with the present invention a process for forming a color image sensor cell, featuring the use of a dielectric layer, used to protect the surface of a wire bond pad from wet developer procedures, used to define the color filter elements of the cell, is described. After formation of metal structures such as cell electrode, picture elements, and a wire bond pad, a passivation layer, comprised of an underlying layer of silicon oxide, and an overlying layer of silicon nitride, is deposited. A first planarization layer of photoresist is next applied. Color filter elements are then formed on the top surface of the first planarization layer, with the top surface of the wire bond pad protected by the passivation layer, during the fabrication of the color filter elements. After application of a second planarization layer, the portion of the contact hole, overlying the bond pad structure is defined via photolithographic exposure and wet development procedures, with the opening to the wire bond pad then finalized via a dry etching procedure, removing the portion of exposed passivation layer.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
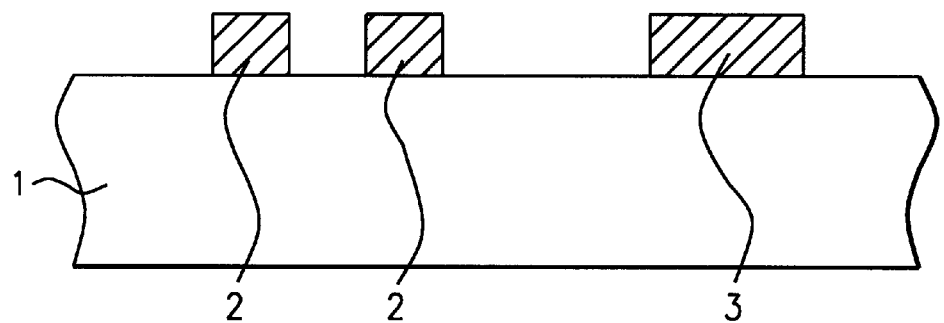
FIGS. 1–7, which schematically, in cross-sectional style, describe key stages of fabrication of a color image sensor cell, featuring the use of a passivation layer, overlying and protecting the wire bond pad structure, during the definition of the color filter elements.

The method of protecting a wire bond pad structure, of a color image sensor cell, during the wet developer steps used for the formation of color filter elements, will now be described in detail. A semiconductor substrate 1, comprised of P type, single crystalline silicon, with a<100>crystallographic orientation, is used and schematically shown in FIG. 1. Metal structures 2, comprised of either aluminum-copper- silicon, (Al—Cu—Si), or aluminum - copper, (Al—Cu), used as cell electrodes, which constitutes a picture element, and metal structure 3, also comprised of either Al—Cu—Si, or Al—Cu, used as a bond pad, are also schematically shown in FIG. 1, located on semiconductor substrate 1. These metal structures can be located entirely on semiconductor substrate 1, or can be located overlying a portion of semiconductor substrate 1, located in an opening in an insulator layer, which is formed on semiconductor substrate 1. The insulator layer, and the opening in the insulator layer, is not shown in the drawings. Bond pad structure 3, is used to make an electrical connection to an external circuit, not shown in the drawings. Metal structures 2 and 3, comprised of either Al—Cu—Si, or Al—Cu, are formed via the plasma vapor deposition (PVD) procedures, to a thickness between about 5000 to 9000 Angstroms, followed by conventional photolithographic and dry etching procedures, using $SF_6$ or $Cl_2$ as an etchant. The photoresist shape, used to define the metal structures is removed via plasma oxygen ashing and careful wet cleans.

Figure 2:
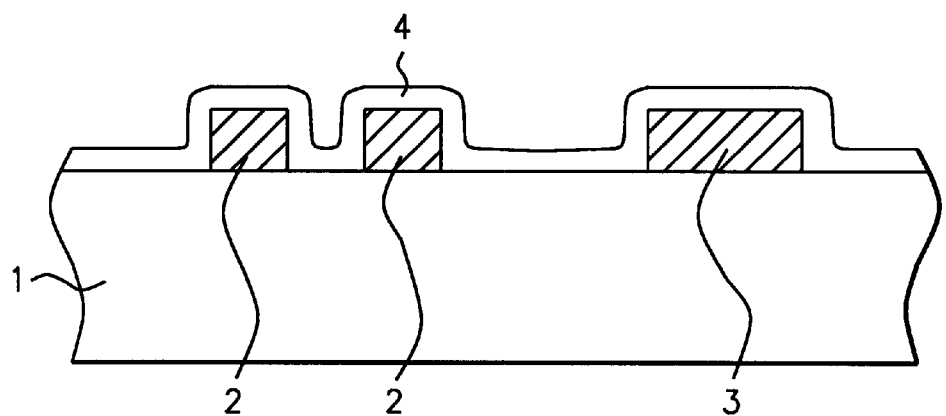
Figure 3:
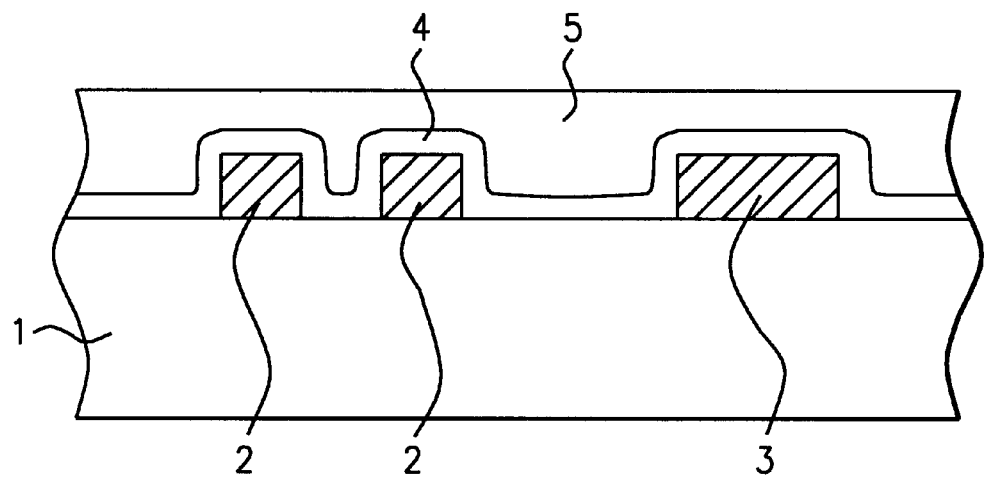

A critical passivation layer 4, is next deposited via plasma enhanced chemical vapor deposition, (PECVD), procedures. Passivation layer 4, is comprised of an underlying, silicon oxide layer, at a thickness between about 1500 to 2500 Angstroms, and an overlying silicon nitride layer, at a thickness between about 6500 to 7500 Angstroms. This is schematically shown in FIG. 2. An anneal procedure used to recover the plasma damage and charging effects of the front end process is then performed at a temperature between about 400 to 4200° C., in a nitrogen ambient, for a time between about 20 to 40 min. A first planarization layer 5, comprised of a photosensitive, transparent photoresist, is next formed at a thickness between about 2 to 3 um, overlying passivation layer 4. This is schematically shown in FIG. 3.

Figure 4:
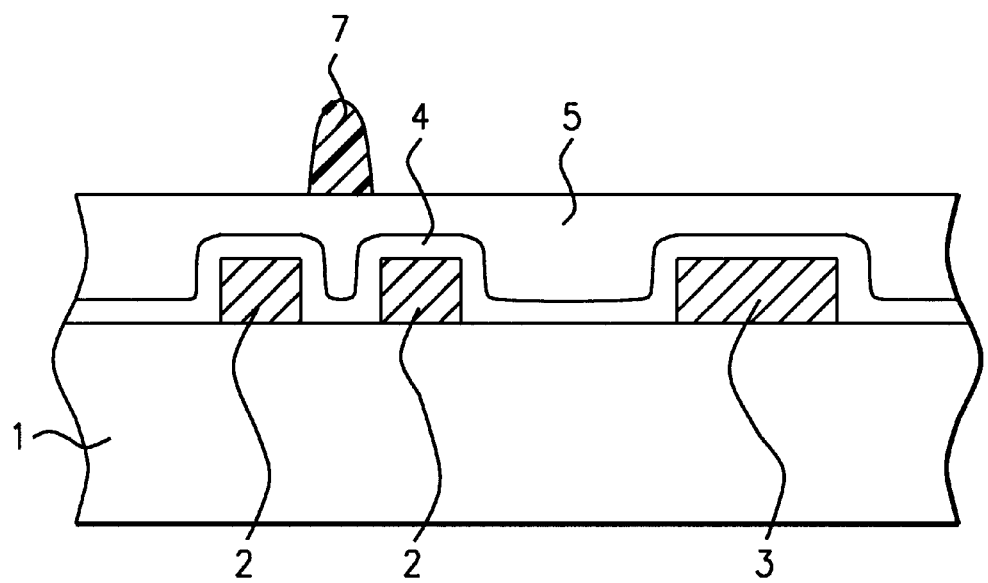
Figure 5:
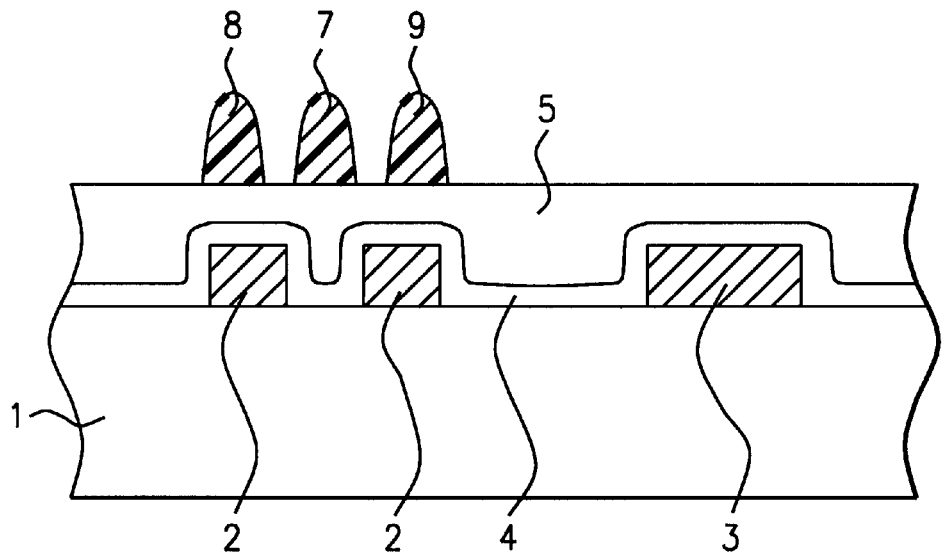

FIGS. 4 and 5, schematically show the formation of the color filter elements 7, 8, and 9. Green pixel element 7, is formed via application of a photosensitive, organic photoresist. Patterning of the green photoresist is achieved via conventional photolithographic exposure and development procedures, using a photolithographic plate as a mask. This is shown schematically in FIG. 4. Of greatest importance is the protection of bond pad structure 3, by passivation layer 4, during the developer cycle used for definition of the green pixel element. After definition of color element 7, a hard plate baking is performed at a temperature between about 200 to 250° C.

The definition of color elements 8 and 9, or of blue pixel element 8, and red pixel element 9, are next addressed and schematically shown in FIG. 5. Again a photosensitive, organic photoresist is applied, followed by a photolithographic exposure and development procedure, using a photolithographic plate as a mask, resulting in the definition of color element 8. The top surface of bond pad structure 3, was again protected from the developer solution, during the removal of the photoresist layer, by overlying passivation layer 4. A hard plate baking, again performed at a temperature between about 200 to 250° C., is then performed. The definition of color filter element, or red pixel element 9, is next addressed, using identical process sequences used previously for color filter elements 7 and 8. Again bond pad structure 3, is protected from developer solution, during removal of the organic layer. Another hard plate baking is then performed, again at a temperature between about 200 to 250° C.

Figure 6:
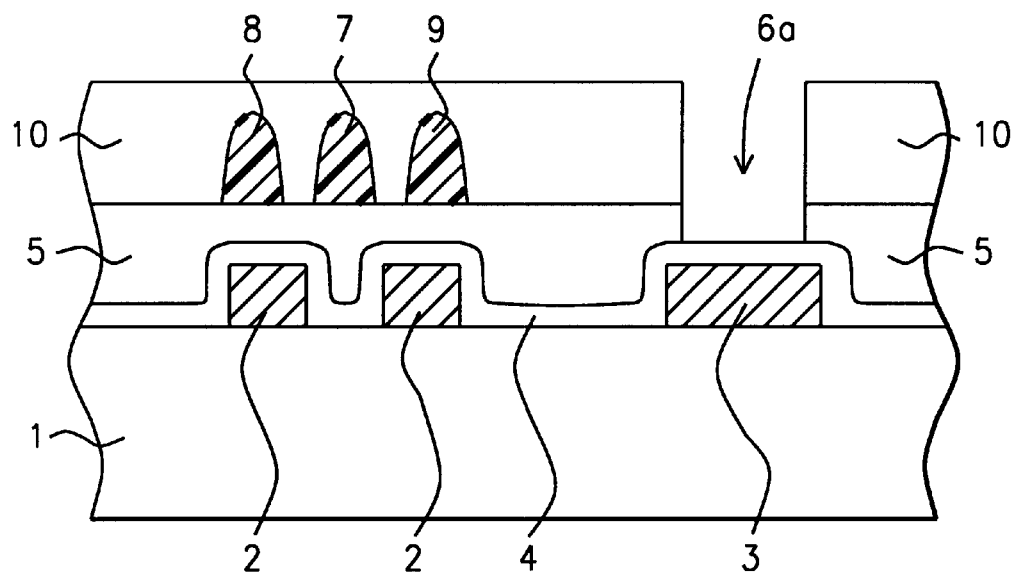
Figure 7:
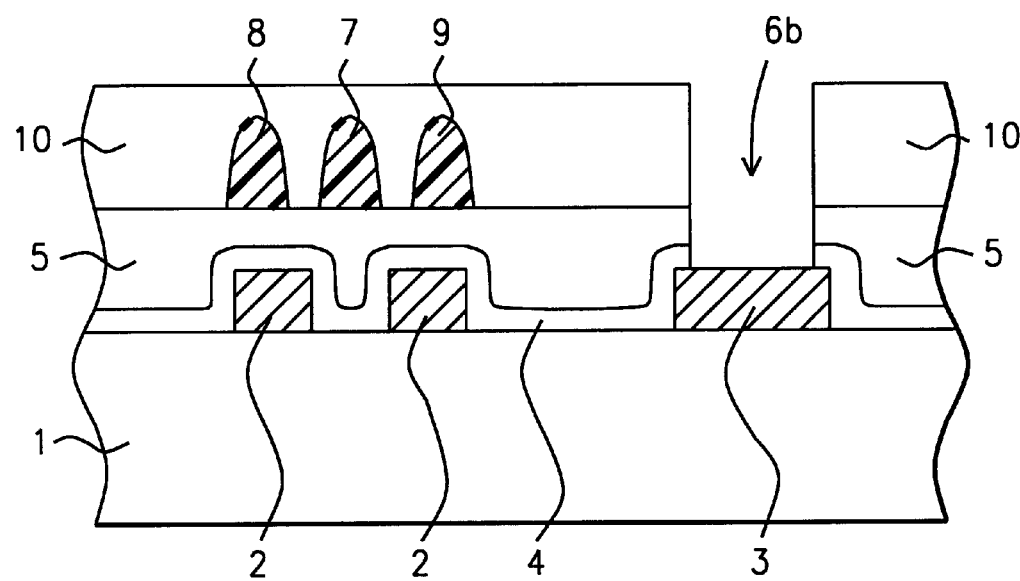

A second planarization layer 10, comprised of a photosensitive, transparent photoresist, at a thickness between about 2 to 3 um, is next coated, and schematically shown in FIG. 6. Conventional photolithographic expose and develop procedures, using an alkaline developer solution, are used to selectively create contact hole opening 6a, in second planarization layer 10, and in first planarization layer 5, with contact hole 6a, overlying bond pad structure 3. This is also schematically shown in FIG. 6. The top surface of bonding pad structure 3, was again protected by passivation layer 4, during the development cycle of this procedure. After hard plate baking procedure, again performed at a temperature between about 200 to 250° C., a dry etch procedure is employed to open final contact hole 6b, exposing a portion of the top surface of bond pad structure 3. The dry etching procedure, is an anisotropic reactive ion etch, (RIE), procedure, performed using $CF_4$ as an etchant for the silicon nitride component of passivation layer 3, and using $CHF_3$ as an etchant for the silicon oxide component. This is schematically shown in FIG. 7. The use of the process sequence, described in this invention, prevented the deleterious effect of the bonding pad being subjected to the developer solution used for definition of the color filter elements.

Finally fabrication of microlens elements, (not shown in the drawings), is performed on the top of the color elements, with the microlens elements employed to enhance the sensitivity of the color image cell. The microlens element is formed via application of a photosensitive, transparent organic layer, followed by a patterning procedure employing a photolithographic plate, conventional exposure, and development procedures, using an alkaline developer. After definition of the microlens element, a baking procedure is used to round the microlens element to increase focusing of incidence light.

While this invention has been particularly shown and described with reference to the preferred embodiments thereof, it will be understood by those skilled in the art that various changes in form and details may be made without departing from the spirit or scope of the invention.

What is claimed is:

1. A method of forming a color image sensor cell on a semiconductor substrate, using a composite insulator layer to protect a bonding pad structure from a series of alkaline developer steps, used during the photolithographic definition of color filter elements, comprising the steps of:

forming metal cell electrode structures, on a first region of said semiconductor substrate;

forming a bonding pad structure, for said color image sensor cell, on a second region of said semiconductor substrate;

depositing said composite insulator layer, comprised of an underlying silicon oxide layer, and an overlying silicon nitride layer;

forming a first planarization layer on said composite insulator layer;

forming a first color filter element, on a first region of said first planarization layer, using a first photolithographic exposure and an alkaline developer;

forming a second color filter element, on a second region of said first planarization layer, using a second photolithographic exposure and an alkaline developer forming a third color filter element, on a third region of said first planarization layer, using a third photolithographic exposure and an alkaline developer;

forming a second planarization layer on said color filter elements, and on regions of said first planarization layer, not covered by said color filter elements;

defining an opening in said second planarization layer, and in said first planarization layer, using a fourth photolithographic exposure, and an alkaline developer, exposing the region of said composite insulator layer located in the area in which said composite insulator layer overlays said portion of said bonding pad structure;

performing a dry etch procedure to remove the portion of said composite insulator layer, exposed in said opening, forming a contact hole opening, exposing said portion of said bond pad; and forming microlens elements on the top surface of said second planarization layer.

2. The method of claim 1, wherein said bond pad structure is comprised of either Al—Cu—Si, or Al—Cu, obtained via plasma deposition procedures, at a thickness between about 5000 to 9000 Angstroms, and defined via photolithographic and reactive ion etching, (RIE), procedures, using $SF_6$ or $Cl_2$ as an etchant.

3. The method of claim 1, wherein said underlying silicon oxide layer, of said composite insulator layer, is obtained via plasma enhanced chemical vapor deposition, (PECVD), procedures, at a thickness between about 1500 to 2500 Angstroms, and wherein said overlying silicon nitride layer, of said composite insulator layer, is obtained via PECVD procedures, at a thickness between about 6500 to 7500 Angstroms.

4. The method of claim 1, wherein said first planarization layer is a photosensitive, transparent photoresist layer, applied to a thickness between about 2 to 3 um.

5. The method of claim 1, wherein said first color filter element is a green color filter element, formed via: application of a photosensitive, organic layer.

6. The method of claim 1, wherein said second color filter element is a blue color filter element, formed via: application of a photosensitive, organic layer.

7. The method of claim 1, wherein said third color filter element is a red color filter element, formed via: application of a photosensitive, organic layer.

8. The method of claim 1, wherein said second planarization layer is a photosensitive, transparent photoresist layer, applied to a thickness between about 2 to 3 um.

9. The method of claim 1, wherein said dry etching procedure, used to form said contact hole opening, in said composite insulator layer, is performed via an anisotropic RIE procedure, using $CF_4$ as an etchant for said overlying silicon nitride layer, and using $CHF_3$ as an etchant for said underlying silicon oxide layer.

* * * * *